United States Patent
Hung

(10) Patent No.: US 8,486,241 B2
(45) Date of Patent: Jul. 16, 2013

(54) SPUTTERING APPARATUS HAVING GAS SUPPLY SYSTEM

(75) Inventor: Hsin-Chin Hung, Taipei Hsien (TW)

(73) Assignee: Hon Hai Precision Industry Co., Ltd., New Taipei (TW)

( * ) Notice: Subject to any disclaimer, the term of this patent is extended or adjusted under 35 U.S.C. 154(b) by 244 days.

(21) Appl. No.: 12/850,635

(22) Filed: Aug. 5, 2010

(65) Prior Publication Data

US 2011/0278163 A1 Nov. 17, 2011

(30) Foreign Application Priority Data

May 17, 2010 (TW) .................................. 99115636

(51) Int. Cl.
*C23C 14/54* (2006.01)

(52) U.S. Cl.
USPC ...................................... 204/298.07; 366/107

(58) Field of Classification Search
USPC ........................................................ 336/107
See application file for complete search history.

(56) References Cited

U.S. PATENT DOCUMENTS

| | | | | |
|---|---|---|---|---|
| 5,833,765 A | * | 11/1998 | Flynn et al. | 134/22.12 |
| 6,494,608 B1 | * | 12/2002 | Retamal et al. | 366/132 |
| 2007/0022952 A1 | * | 2/2007 | Ritchie et al. | 118/715 |
| 2008/0185284 A1 | * | 8/2008 | Chen et al. | 204/164 |
| 2009/0120802 A1 | * | 5/2009 | Ciampi et al. | 205/543 |
| 2010/0184249 A1 | * | 7/2010 | Chen | 438/72 |

* cited by examiner

*Primary Examiner* — Keith Hendricks
*Assistant Examiner* — Timon Wanga
(74) *Attorney, Agent, or Firm* — Altis Law Group, Inc.

(57) ABSTRACT

An exemplary gas supply system, includes a plurality of first input lines for supplying gas, a plurality of second input lines, a plurality of third input lines, a first mixing tank communicating with the second input lines, a second mixing tank communicating with the third input lines, and a plurality of three-way valves. Each three-way valve is communicated with a first input line, a second input line and a third input line such that gas in the first input lines can be selectively introduced into the first mixing tank or the second mixing tank.

8 Claims, 2 Drawing Sheets

SPUTTERING APPARATUS HAVING GAS SUPPLY SYSTEM

BACKGROUND

1. Technical Field

The present disclosure relates to sputtering apparatuses, and particularly, to a gas supply system and a sputtering apparatus including the gas supply system.

2. Description of Related Art

Sputtering technology has been widely employed for improving surface properties of workpieces. In a conventional sputtering process, a number of film layers are formed layer by layer on a workpiece positioned in a sputtering chamber. Prior to forming each film layer, different gases are mixed in a tank for obtaining a mixed reactive gas, and then the mixed reactive gas enters the sputtering chamber.

However, two film layers are usually formed in different mixed reactive gas atmosphere occurring within the sputtering chamber. It requires significant time to mix the reactive gases before forming an upper film on a lower film. As a result, the sputtering process is interrupted to wait for the reactive gases to mix, which decreases sputtering efficiency. Therefore, a gas supply system and a sputtering apparatus having the same are desired.

BRIEF DESCRIPTION OF THE DRAWINGS

Many aspects of the present gas supply system and the sputtering apparatus can be better understood with reference to the following drawings. The components in the drawings are not necessarily drawn to scale, the emphasis instead being placed upon clearly illustrating the principles of the present system and the apparatus. Moreover, in the drawings, like reference numerals designate corresponding parts throughout the views.

DETAILED DESCRIPTION

Figure 1:
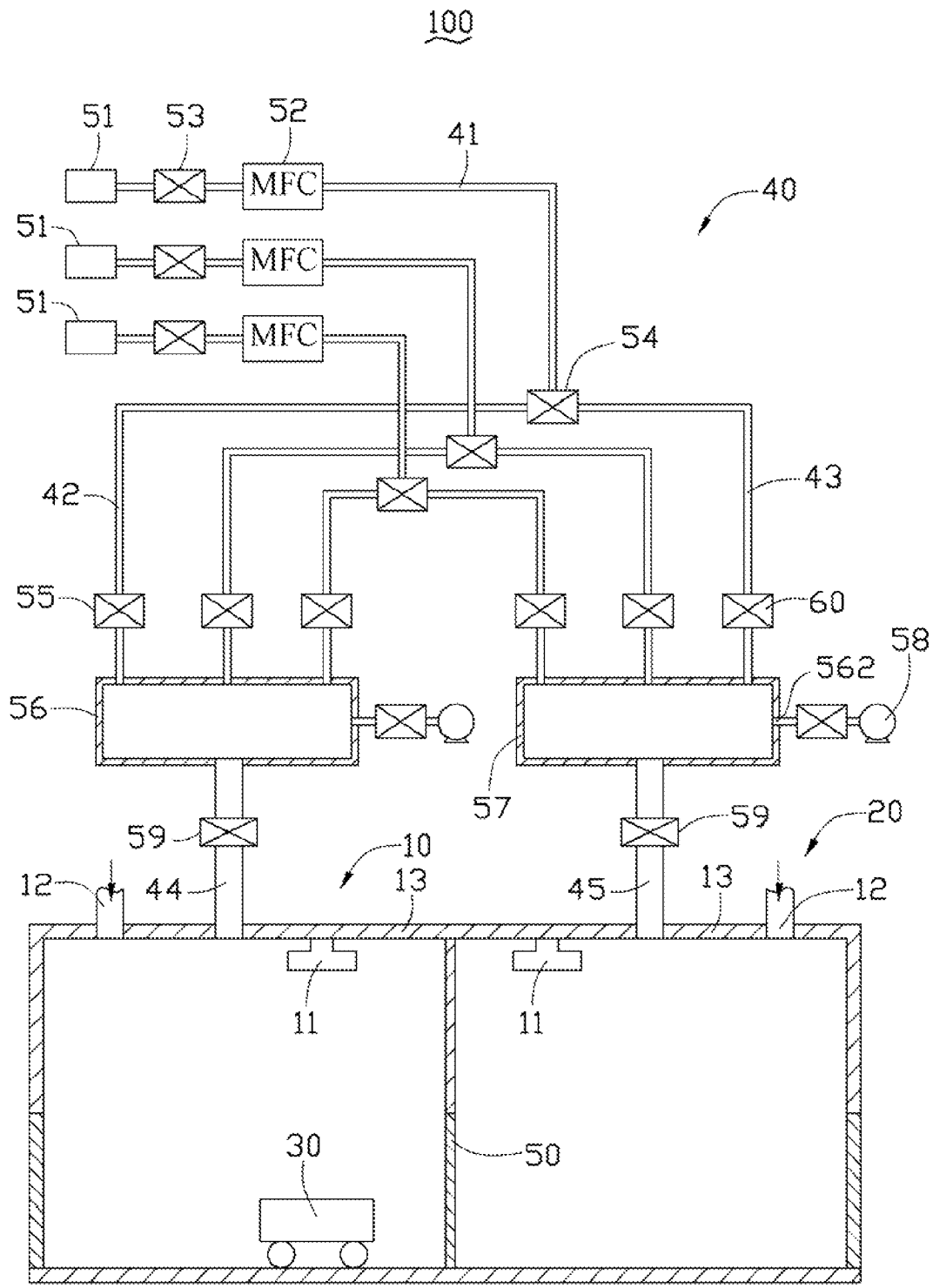
FIG. 1 is an isometric view of a sputtering apparatus having a gas supply system in accordance with a first embodiment.

Referring to FIG. 1, a sputtering apparatus 100 includes a first sputtering chamber 10, a second sputtering chamber 20, a conveyor device 30, and a gas supply system 40.

The conveyor device 30 is configured for conveying workpieces from the first sputtering chamber 10 to the second sputtering chamber 20. A door 50 is arranged between the first sputtering chamber 10 and the second sputtering chamber 20. Thereby, when the door 50 is open, workpieces can be conveyed from the first sputtering chamber 10 into the second sputtering chamber 20.

The two sputtering chambers each includes a target 11 positioned on a top wall 13 thereof. Additionally, the two sputtering chambers respectively define an inert gas inlet 12 in the top wall 13.

The gas supply system 40 includes three first input lines 41, three three-way valve 54, three second input lines 42, three third input lines 43, a first mixing tank 56, a first output line 44, a second mixing tank 57 and a second output line 45.

Each first input line 41 includes a reactive gas source 51, a first valve 53, a mass flow controller (MFC) 52 arranged therein in that order. The reactive gas source 51 is configured for providing reactive gas for sputtering process. In the present embodiment, the three reactive gas sources 51 respectively provide nitrogen gas, acetylene gas, and oxygen gas. Each first input line 41 intersects with a corresponding second input line 42 and a corresponding third input line 43 at a corresponding three-way valve 54. That means the second input lines 42 are in parallel connection with the third input lines 43.

The three second input lines 42 and the first output line 44 communicate with the first mixing tank 56. The three third input lines 43 and the second output line 45 communicate with the second mixing tank 57. Each second input line 42 includes a second valve 55 arranged between the corresponding three-way valve 54 and the first mixing tank 56. Each third input line 43 includes a third valve 60 arranged between the corresponding three-way valve 54 and the second mixing tank 57. In this manner, each reactive gas source 51 is capable of alternately supplying reactive gas into the first mixing tank 10 or the second mixing tank 20.

A fourth valves 59 is respectively arranged in the first output line 44 and the second output line 45. The first output line 44 communicates with the first sputtering chamber 10, while the second output line 45 communicates with the second sputtering chamber 20. In addition, a pump 58 is employed for pumping mixed gas out of the first mixing tank 56 or the second mixing tank 57.

In actual use, for instance, in a sputtering process, three different kinds of reactive gases are first supplied from the three reactive gas sources 51, then flow into the first mixing tank 56 under a control of a corresponding MFC 52 and a three-way valve 54. Thereby, a first mixed gas is obtained in the first mixing tank 56. The fourth valve 59 is subsequently opened, the first mixed gas flows into the first sputtering chamber 10. An inert gas is applied into the first sputtering chamber 10. Thus, a lower film can be formed on a workpiece in the first sputtering chamber 10. Meanwhile, the three first input lines 41 communicate with the third input lines 43 under a control of the three three-way valves 54. It is understood that three different kinds of reactive gases flow into the second mixing tank 57, and a second mixed gas is obtained. When finishing forming the lower film on the workpiece, the workpiece immediately enters into the second sputtering chamber 20. The fourth valve 59 between the second mixing tank 57 and the second sputtering chamber 20 is opened, and the second mixed gas flows into the second sputtering chamber 20. Thereby, an upper film can be formed on the lower film of the workpiece. Meanwhile, the first input lines 41 are controlled to communicate with the second input lines 42, and three different kinds of reactive gases simultaneously flow into the first mixing tank 56. In this way, the first and second mixing tank 56, 57 alternately supply mixed reactive gas. Time for mixing reactive gases is saved and the sputtering apparatus 100 is continuously operated.

If few first mixed gas is retained in the first mixing tank 56 after forming the lower film on the workpiece, the second valves 55 in the second input lines 42 and the third valve 59 in the first output line 44 are simultaneously shut off, and the pump 58 pumps the retained first mixed gas out of the first mixing tank 56. And then, three gas sources begin to supply reactive gases into the first mixing tank 56.

Figure 2:
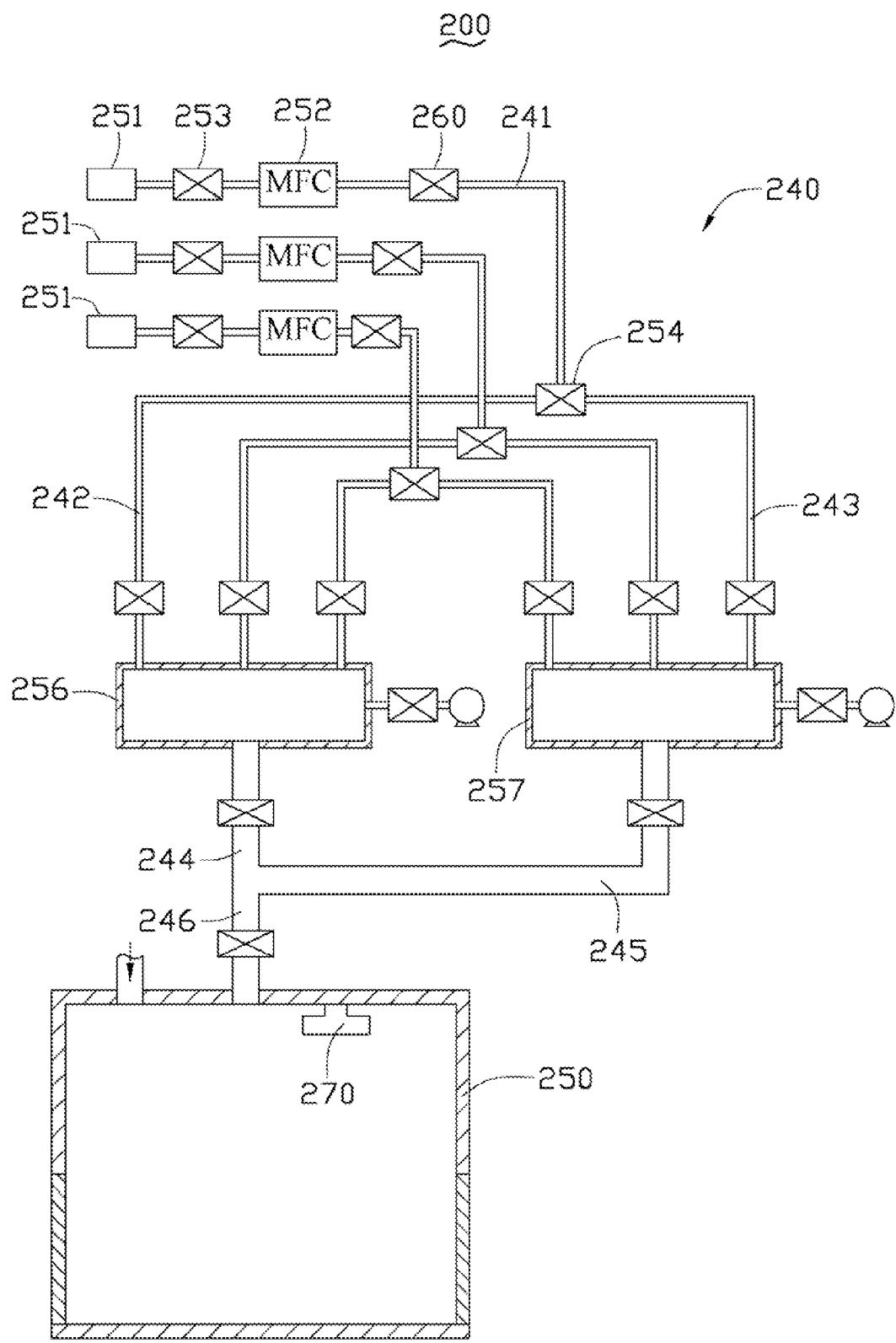
FIG. 2 is an isometric view of another sputtering apparatus having a gas supply system in accordance with a second embodiment.

Referring to FIG. 2, another sputtering apparatus 200 provided in a second embodiment includes a gas supply system 240 and a sputtering chamber 250 including a target 270 positioned on a top wall thereof.

The gas supply system 240 has similar configuration with that of the gas supply system 40, and includes three first input lines 241, three three-way valves 254, three second input lines 242, a first mixing tank 256, three third input lines 243, a second mixing tank 257, a first output line 244 and a second output line 245. A reactive gas source 251, a first valves 253, a MFC 252 are arranged in each of the three first input lines 241 in that order.

Additionally, a check valve 260 is arranged between a corresponding MFC 252 and a corresponding three-way valve 254. The check valve 260 prevents the mixed reactive gas in the first mixing tank 256 or the second mixing tank 257 from reflowing into the MFC 252.

Furthermore, a third output line 246 is included. The first output line 244 intersects with the second output line 245 at the third output line 246. The third output line 246 communicates with the sputtering chamber 250.

It is understood that the above-described embodiments are intended to illustrate rather than limit the disclosure. Variations may be made to the embodiments and methods without departing from the spirit of the disclosure. Accordingly, it is appropriate that the appended claims be construed broadly and in a manner consistent with the scope of the disclosure.

What is claimed is:

1. A sputtering apparatus, comprising:
   a sputtering chamber; and
   a gas supply system for supplying mixed gas into the sputtering chamber, the gas supply system comprising:
   a plurality of first input lines for supplying gas;
   a plurality of second input lines;
   a plurality of third input lines;
   a first mixing tank communicating with the second input lines and the sputtering chamber;
   a second mixing tank communicating with the third input lines and the sputtering chamber;
   a first output line communicating with the first mixing tank, a second output line communicating with the second mixing tank, and a third output line connected to a joining portion between the first output line and the second output line, wherein the third output line communicates with the sputtering chamber; and
   a plurality of three-way valves, each three-way valve communicating with a respective one of the first input lines, a respective one of the second input lines and a respective one of the third input lines such that gas in the first input lines can be alternately introduced into the first mixing tank or the second mixing tank.

2. The sputtering apparatus of claim 1, wherein the gas supply system further comprises two pumps respectively communicating with the first mixing tank and the second mixing tank.

3. The sputtering apparatus of claim 1, wherein each of the first input lines comprises a gas source, a first valve, and a mass flow controller arranged in that order, each mass flow controller communicating with the corresponding three-way valve.

4. The sputtering apparatus of claim 3, wherein the gas supply system further comprises a plurality of second valves each arranged in a corresponding second input line and a plurality of third valves each arranged in a corresponding third input line.

5. The sputtering apparatus of claim 3, wherein the gas supply system further comprises a plurality of check valves arranged between the respective mass flow controllers and three-way valves.

6. A sputtering apparatus, comprising:
   a sputtering chamber; and
   a gas supply system for supplying mixed gas into the sputtering chamber, the gas supply system comprising:
   a plurality of first input lines for supplying gas;
   a plurality of second input lines;
   a plurality of third input lines;
   a first mixing tank communicating with the second input lines and the sputtering chamber;
   a second mixing tank communicating with the third input lines and the sputtering chamber;
   a first output line, a second output line, and a third output line, wherein each of the first, second, and third output lines has a first end and an opposite second end, the first end of the first output line communicates with the first mixing tank, the first end of the second output line communicates with the second mixing tank, the first end of the third output line communicates with both the second end of the first output line and the second end of the second output line, and the second end of the third output line communicates with the sputtering chamber; and
   a plurality of three-way valves, each three-way valve communicating with a respective one of the first input lines, a respective one of the second input lines and a respective one of the third input lines such that gas in the first input lines can be alternately introduced into the first mixing tank or the second mixing tank.

7. A sputtering apparatus, comprising:
   a first sputtering chamber and a second sputtering chamber;
   a gas supply system for supplying mixed gas into the first and second sputtering chambers, the gas supply system comprising:
   a plurality of first input lines for supplying gas;
   a plurality of second input lines;
   a plurality of third input lines;
   a first mixing tank communicating with the second input lines and the first sputtering chamber;
   a second mixing tank communicating with the third input lines and the second sputtering chamber;
   a first output line communicating with the first mixing tank and the first sputtering chamber, to transmit the mixed gas from the first mixing tank to the first sputtering chamber;
   a second output line communicating with the second mixing tank and the second sputtering chamber, to transmit the mixed gas from the second mixing tank to the second sputtering chamber; and
   a plurality of three-way valves, each three-way valve communicating with a respective one of the first input lines, a respective one of the second input lines and a respective one of the third input lines such that gas in the first input lines can be alternately introduced into the first mixing tank or the second mixing tank.

8. The sputtering apparatus of claim 7, further comprising a conveyor device and a door arranged between the first sputtering chamber and the second sputtering chamber, wherein the conveyor device is configured for conveying workpieces from the first sputtering chamber to the second sputtering chamber or from the second sputtering chamber to the first sputtering chamber when the door is open.

* * * * *